United States Patent [19]

Kalinoski

[11] Patent Number: 5,910,524

[45] Date of Patent: Jun. 8, 1999

[54] CORROSION-RESISTANT, FORM-IN-PLACE EMI SHIELDING GASKET

[75] Inventor: John P. Kalinoski, Chelmsford, Mass.

[73] Assignee: Parker-Hannifin Corporation, Cleveland, Ohio

[21] Appl. No.: 08/944,897

[22] Filed: Oct. 6, 1997

Related U.S. Application Data

[63] Continuation-in-part of application No. 08/375,853, Jan. 20, 1995, abandoned.

[51] Int. Cl.$^6$ ...................................................... C08K 9/00
[52] U.S. Cl. ............................ 523/215; 524/440; 521/82; 427/387; 428/447; 24/40.3; 24/40.1; 24/40.7
[58] Field of Search ........................... 524/440; 523/215; 521/82; 427/387; 428/447; 264/40.3, 40.7, 40.1

[56] References Cited

U.S. PATENT DOCUMENTS

| | | |
|---|---|---|
| 2,796,457 | 6/1957 | Stinger . |
| 3,032,528 | 5/1962 | Nitzsche et al. . |
| 3,126,440 | 3/1964 | Goodloe . |
| 3,140,342 | 7/1964 | Ehrreich et al. . |
| 3,752,899 | 8/1973 | Bakker . |
| 3,880,627 | 4/1975 | Morton . |
| 3,889,043 | 6/1975 | Ducros . |
| 4,011,360 | 3/1977 | Walsh . |
| 4,037,009 | 7/1977 | Severinsen . |
| 4,295,573 | 10/1981 | Terry et al. . |
| 4,434,541 | 3/1984 | Powers, Jr. . |
| 4,507,359 | 3/1985 | Powers, Jr. . |
| 4,643,863 | 2/1987 | Martini . |
| 4,643,864 | 2/1987 | Martini . |
| 4,643,924 | 2/1987 | Uken et al. . |
| 4,664,971 | 5/1987 | Soens . |
| 4,678,716 | 7/1987 | Tzeng . |
| 4,678,863 | 7/1987 | Reese et al. . |
| 4,690,831 | 9/1987 | Uken et al. . |
| 4,734,140 | 3/1988 | Tzeng . |
| 4,769,280 | 9/1988 | Powers, Jr. . |
| 4,779,762 | 10/1988 | Klein et al. . |
| 4,818,437 | 4/1989 | Wiley . |
| 4,857,668 | 8/1989 | Buonanno . |
| 4,861,643 | 8/1989 | Scollard ................................. 428/162 |
| 4,865,905 | 9/1989 | Uken . |
| 4,869,954 | 9/1989 | Sauitieri . |
| 4,882,089 | 11/1989 | Iwaskow et al. . |
| 4,900,877 | 2/1990 | Dubrow et al. . |
| 4,915,985 | 4/1990 | Maxfield et al. ..................... 427/126.6 |
| 4,931,326 | 6/1990 | Weil . |
| 4,931,479 | 6/1990 | Morgan . |
| 4,948,922 | 8/1990 | Varadan et al. . |
| 4,977,295 | 12/1990 | Chin et al. . |
| 5,008,485 | 4/1991 | Kitagawa . |
| 5,045,635 | 9/1991 | Kaplo et al. . |
| 5,047,260 | 9/1991 | Durand ................................... 427/54.1 |
| 5,061,566 | 10/1991 | Morgan . |
| 5,068,493 | 11/1991 | Benn, Sr. et al. . |
| 5,107,070 | 4/1992 | Benn, Sr. et al. . |
| 5,115,104 | 5/1992 | Bunyan . |
| 5,137,766 | 8/1992 | Mazanek et al. . |
| 5,187,225 | 2/1993 | Kitagawa ................................ 524/847 |
| 5,202,536 | 4/1993 | Buonanno . |
| 5,250,607 | 10/1993 | Comert et al. . |
| 5,256,480 | 10/1993 | Inoue et al. . |
| 5,270,364 | 12/1993 | Schwartz et al. . |
| 5,284,888 | 2/1994 | Morgan ................................... 528/83 |
| 5,473,111 | 12/1995 | Hattori et al. ........................ 174/35 R |
| 5,566,055 | 10/1996 | Salvi, Jr. . |

FOREIGN PATENT DOCUMENTS

| | | |
|---|---|---|
| A-63355/94 | 12/1994 | Australia . |
| 1116650 | 1/1982 | Canada . |
| 1116650 | 1/1992 | Canada . |
| 2125742 | 12/1994 | Canada . |
| 0182391 | 5/1986 | European Pat. Off. . |
| 0241192 | 10/1987 | European Pat. Off. . |
| 0326704 | 8/1989 | European Pat. Off. . |
| 0 629 114 A1 | 12/1994 | European Pat. Off. . |
| 0 643 552 A1 | 3/1995 | European Pat. Off. . |
| 2480488 | 10/1981 | France . |
| 8912397 | 1/1990 | Germany . |
| 9404291 | 7/1994 | Germany . |
| 5-7177 | 1/1993 | Japan . |
| 2115084 | 9/1983 | United Kingdom . |

OTHER PUBLICATIONS

Dynafoam™ Technical Guide, Mar., 1992.

King, G.D., SAE Technical Paper Series, "Improved Foam In Place Gasketing Material", Feb. 26–Mar. 2, 1990.

*Primary Examiner*—Melvyn I. Marquis
*Attorney, Agent, or Firm*—John A. Molnar, Jr.

[57] ABSTRACT

An electrically-conductive, corrosion-resistant EMI shielding gasket having an EMI shielding effectiveness of at least about 80 dB at between about 10 MHz and 10 GHz. The gasket is formed-in-place on a surface of a substrate as applied to such surface in a form-stable bead of a fluent polymeric reaction system and cured thereon under substantially atmospheric pressure. The reaction system has a strip volume resistivity of from about 500–1000 mΩ-cm and is admixture of: (a) an elastomeric resin binder component; and (b) an electrically-conductive filler component of nickel-coated graphite particles. The substrate surface may be that of a housing or other enclosure for electronic components.

36 Claims, 2 Drawing Sheets

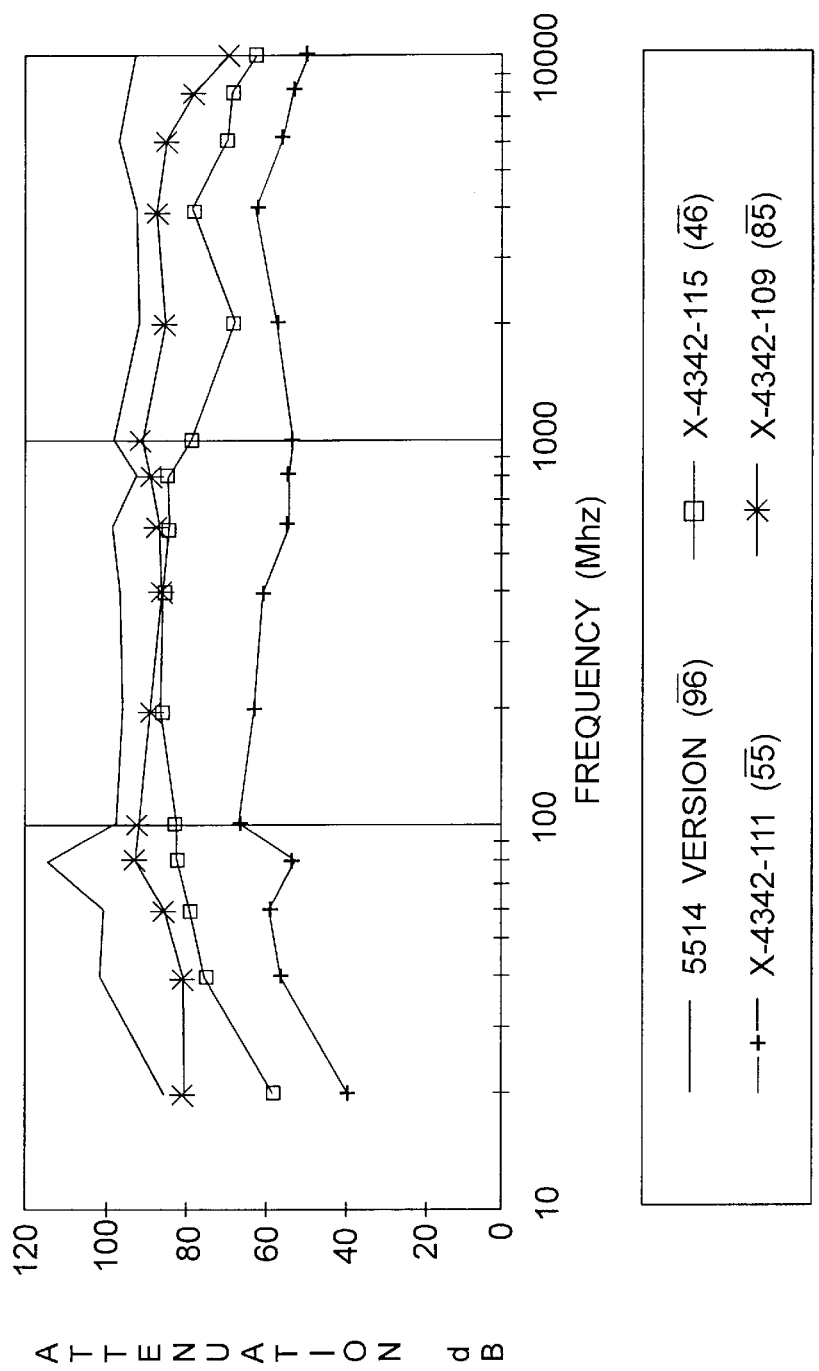

CORROSION-RESISTANT, FORM-IN-PLACE EMI SHIELDING GASKET

CROSS-REFERENCE TO RELATED APPLICATION

This application is a continuation-in-part of application Ser. No. 08/375,853 filed on Jan. 20, 1995, abandoned.

BACKGROUND OF THE INVENTION

The present invention relates broadly to form-in-place (FIP) electromagnetic interference (EMI) shielding gaskets or seals, and particularly to a corrosion-resistant EMI shielding gasket, as formed and cured in place under atmospheric pressure on the surface of a substrate, which exhibits unexpectedly high levels of EMI shielding effectiveness.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, or silicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

More recently, a form-in-place (FIP) process has been proposed for the manufacture of EMI shielding gaskets. As is described in commonly-assigned, co-pending applications U.S. Ser. No. 08/119,403 filed Sep. 10, 1993, abandoned; U.S. Ser. Nos. 08/375,853 filed Jan. 20, 1995, abandoned; 08/377,412 filed Jan. 24, 1995, now U.S. Pat. No. 5,641,438; U.S. Ser. No. 08/421,847 filed Mar. 14, 1995, abandoned; U.S. Ser. No. 08/422,629 filed Apr. 14, 1995, abandoned; and U.S. Ser. No. 08/761,419 filed Dec. 6, 1996, abandoned; and in European Patent EP 629,114; German Patent DE 4,319,965; Canadian Patent Application 2,125,742; and Japanese Patent Publication (Kokai) No. 7177/1993, such process involves the application of a bead of a viscous, curable, electrically-conductive composition in a fluent state to a surface of a substrate such as a housing or other enclosure. The composition, typically a silver-filled silicone elastomer, then is cured-in-place via the application of heat or with atmospheric moisture or ultraviolet (UV) radiation to form an electrically-conductive, elastomeric EMI shielding gasket in situ on the substrate surface. By forming and curing the gasket in place directly on the substrate surface, the need for separate forming and installation steps is obviated. Moreover, the gasket may be adhered directly to the surface of the substrate to further obviate the need for a separate adhesive component or other means of attachment of the gasket to the substrate. In contrast to more conventional die cutting or molding processes, the flashless FIP process reduces waste generation, and additionally is less labor intensive in that the need for hand assembly of complex gasket shapes or the mounting of the gasket into place is obviated. The process further is amenable to an automated or roboticly-controlled operation, and may be employed to fabricate complex gasket geometries under atmospheric pressure and without the use of a mold.

As the above-described FIP process continues to garner commercial acceptance, it will be appreciated that further improvements in this process and in materials therefor would be well-received by the electronics industry. In this regard, electronic devices frequently are used outdoors or otherwise are exposed to harsh service environments which may include wet, humid, or other corrosive conditions. Within such environments, the silver filler of conventional FIP gasket compositions may be subjected to galvanic or other corrosion resulting in the formation of an non-conductive surface oxide layer and, ultimately, a reduction in the EMI shielding effectiveness of the gasket. Especially desired therefore would be a corrosion-resistant, silicone-based FIP composition which could be easily and economically applied in a fluent state directly to a housing or other enclosure for forming an electrically-conductive EMI shielding gasket.

BROAD STATEMENT OF THE INVENTION

The present invention is directed to a reaction system for a corrosion-resistant, formed-in-place, electrically-conductive EMI shielding gasket, and to such a corrosion-resistant gasket, as formed and cured in place under atmospheric pressure on the surface of a substrate, having unexpectedly high levels of EMI shielding effectiveness. In a preferred embodiment, the gasket is formed-in-place as a cured bead of a reaction system which may be formulated as including a vinyl-functional siloxane polymer, a hydride-functional siloxane, a platinum or other metal catalyst, and a nickel-coated graphite, particulate filler. The filler, generally containing about 60–70% by weight of nickel, may be loaded into the reaction system at about 50–60% by weight and at a particle size of between about 0.25–75 $\mu$m such that the system rheology remains sufficiently fluent to be dispensed under pressure onto the surface of an electronics enclosure or other substrate as a relatively narrow, 1–10 mm wide bead issued from an orifice or nozzle. Advantageously, the gasket thereby formed exhibits improved corrosion resistance as compare to conventional silver-filled, formed-in-place gaskets. Moreover, when substituted for conventional silver-based fillers within a thermal addition curable reaction system, the nickel-graphite filler of the present invention advantageously affords the ability to formulate a one-component reaction system in lieu of the two components which are required of silver-filled compositions to prevent poisoning of the platinum catalyst by the silver. As an additional advantage, the corrosion-resistant FIP EMI shielding gasket of the present invention further has been observed to exhibit primerless adhesion to a variety of metal and plastic substrates.

Nickel-graphite fillers, of course, conventionally have been used in a variety of EMI shielding materials such as extrusions, molded shapes, and coatings. Examples of these conventional uses are described in commonly-assigned U.S. Pat. Nos. 5,061,566 and 5,566,055, with corrosion resistant and other EMI shielding materials being described in commonly-assigned U.S. Pat. No. 5,270,364 and Canadian Patent No. 1,116,650, and in U.S. Pat. No. 4,818,437. Heretofore, however, it is believed that nickel-graphite fillers had not been suggested for use in EMI shielding compositions for FIP gaskets as exhibiting strip volume resistivity values considered too low to provide acceptable EMI shielding effectiveness. That is, at the relatively low filler levels, e.g., 50–60% by weight, and small particle sizes, e.g., 0.25–75 $\mu$m, required for fluent FIP EMI shielding compositions, the nickel-graphite filled composition of the present invention would not be expected to provide acceptable EMI shielding effectiveness based on a relatively high strip volume resistivity herein determined to be about 500–1000 m$\Omega$-cm. By way of comparison, typical silver-based EMI shielding, FIP compositions, in exhibiting strip volume resistivites of about 1–50 m$\Omega$-cm, are on the order of 10–100 times more electrically conductive than the instant nickel-graphite filled composition. Similarly, at the high filler loading levels and correspondingly high electrical conductivities characteristic of EMI shielding coatings, extrusions, and moldings, it is likewise is believed not to be apparent from these materials that a non-molded, corrosion-resistant, nickel-graphite filled FIP gasket could be achieved exhibiting a relatively high EMI shielding effectiveness of about 80 dB or more.

Notwithstanding the conventional wisdom, the present invention nonetheless comprehends a corrosion resistant, nickel-graphite filled gasket which not only exhibits an EMI shielding effectiveness of at least about 80 dB over substantially the entire frequency range of about 10 MHz to about 10 GHz, but also which is formed in place from a reaction system exhibiting a strip volume resistivity, according to D991, of only about 500–1000 m$\Omega$-cm. Without being bound by theory, it is postulated that the EMI absorptive or "lossy" properties of the graphite component of the filler synergistically interact with the electrical conductivity properties of the nickel component to attain an unexpectedly high level of EMI shielding effectiveness in a non-molded, FIP EMI shielding gasket. Advantageously, the corrosion resistance and EMI shielding effectiveness of the inventive FIP gasket are achieved without deleteriously affecting the capability to apply the gasket as a form-stable bead which is cured in place under atmospheric pressure on a surface of a substrate. Indeed, the corrosion resistant, EMI shielding gasket of the present invention may be dispensed under robotic or other pre-programmed control onto the surface of the substrate in a bead having a widthwise dimension of less than about 10 mm, which bead then may be cured on the substrate under atmospheric pressure. The gasket so formed, which may have a Shore A hardness of less than about 60, a force/deflection value of less than about 2.6 kN/m (15 psi), and a compression set of less than about 50%, advantageously may be used even in shielding applications requiring a relatively low closure force of less than about 1 N/cm (5 lb$_f$/in).

In a preferred embodiment of the invention, a one-part, fluent polymeric reaction system is provided which may be applied as a form-stable bead to a surface of a substrate, such as a housing or other enclosure for electronic components, and then cured by thermal-addition thereon under substantially atmospheric pressure to form a corrosion-resistant, electrically-conductive, elastomeric EMI shielding gasket having an EMI shielding effectiveness of at least about 80 dB over substantially the entire frequency range of about 10 MHz to about 10 GHz. The reaction system has a strip volume resistivity of from about 500–1000 m$\Omega$-cm and is an admixture of: (a) a silicone resin binder component including a first functional group; (b) a cross-linking agent component including a second functional group reactive with the first functional group of the binder component; (c) a metallic catalyst component effective to catalyze the reaction of the first and second functional groups; and (d) an electrically-conductive filler component of nickel-coated graphite particles.

In another preferred embodiment of the invention, an electrically-conductive, corrosion-resistant EMI shielding gasket is provided which exhibits an EMI shielding effectiveness of at least about 80 dB over substantially the frequency range of between about 10 MHz and about 10 GHz. The gasket is formed-in-place on a surface of a substrate, such as a housing or other enclosure for electronic components, as applied to such surface in a form-stable bead of a fluent polymeric reaction system and the cured thereon under substantially atmospheric pressure. The reaction system has a strip volume resistivity of from about 500–1000 mΩ-cm and is admixture of: (a) an elastomeric resin binder component; and (b) an electrically-conductive filler component of nickel-coated graphite particles.

Yet another preferred embodiment of the invention involves a method of forming an electrically-conductive, corrosion-resistant elastomeric EMI shielding gasket exhibiting an EMI shielding effectiveness of at least about 80 dB over substantially the frequency range of between about 10 MHz and about 10 GHz. The gasket is formed-in-place on a surface of a substrate such as a housing or other enclosure for electronic components. In accordance with the method, a fluent, polymeric reaction system having a strip volume resistivity of from about 500–1000 mΩ-cm is provided as including: (i) an elastomeric resin binder component; and (ii) an electrically-conductive filler component of nickel-coated graphite particles. The components of the reaction system are admixed to form a fluent reaction mixture, and a bead thereof is applied to the surface of the substrate. The reaction mixture then is cured under substantially atmospheric pressure to form the gasket on the substrate surface.

Advantages of the preferred embodiments of the present invention include the provision of electrically-conductive composition which is curable under atmospheric pressure on the surface of a substrate to form a corrosion-resistant gasket exhibiting unexpectedly high EMI shielding effectiveness. Additional advantages include a one-component reaction system which may be mixed and applied in a fluent state to a surface of an electrical housing or other component, and then cured in situ to form a corrosion-resistant, electrically-conductive gasket providing both environmental sealing and electrical shielding of the housing. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein:

FIG. 3 is a plot of attenuation versus frequency over a range of 10 MHz to 10 GHz comparing the EMI shielding effectiveness of representative nickel-graphite materials formulated in accordance with the present invention with that of a silver-filled control material.

Figure 1:
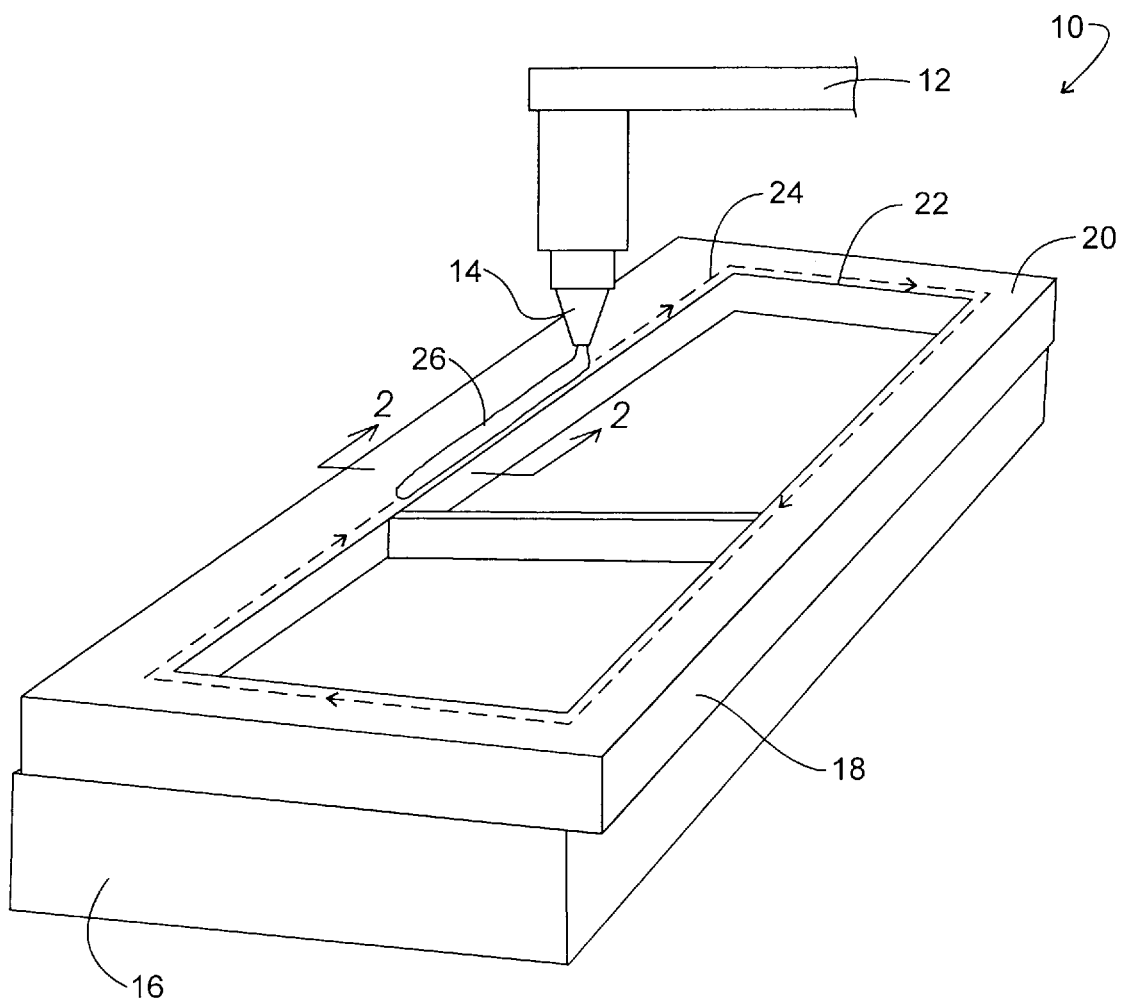
FIG. 1 is a plan view of a preferred arrangement for applying a bead of the curable reaction system of the present invention to the surface of a substrate such as a housing for an electronic device.

The drawings will be described further in connection with the following Detailed Description of the Invention.

DETAILED DESCRIPTION OF THE INVENTION

In accordance with the present invention, a fluent polymeric, curable reaction system is provided as having components which form a corrosion-resistant, electrically-conductive, elastomeric material when admixed and, in a preferred thermal-addition curable embodiment, heated to a predefined cure temperature. Such system is especially adapted for use as a form-in-place (FIP) EMI gasket material in being dispensable as a generally non-slumping or form stable bead of a fluent, viscous admixture which is issued from a nozzle or other orifice onto the surface of a substrate such as the housing of an electronic device. Upon being heated to a predefined temperature or, alternatively, reaction with atmospheric moisture or exposure to ultraviolet (UV) radiation, the material may be cured in situ to form a resilient gasket profile which adheres to the substrate surface. The gasket so formed is capable of filling gaps between mating surfaces of housings and other EMI shielding structures for the environmental sealing thereof, while concomitantly providing for electrical continuity between those surfaces.

In a thermal addition curable embodiment, the reaction system of the present invention is formulated as a fluent admixture of: (a) a binder component having first functional groups; (b) a cross-linking component having second functional groups reactive with the first functional groups of the binder component; (c) a catalyst component effective to catalyze the reaction of the first and second functional groups; and (d) an electrically-conductive filler component of nickel-coated graphite. The reaction system is especially adapted for use in a form-in-place process wherein a fluent bead of the admixed components of the system is applied to the surface of a substrate, such as a housing or other enclosure for electronic components, and then is cured by heating in situ on that surface to form an electrically-conductive, corrosion-resistant, elastomeric EMI shielding gasket. In accordance with the precepts of the present invention, the nickel-coated graphite filler component is blended or otherwise incorporated into the reaction system as a particulate medium, and advantageously affords the gasket with improved corrosion resistance as compared to conventional FIP EMI shielding gaskets formulated with a silver-based filler. In this regard, the gasket of the present invention is characterized as being "corrosion-resistant" in exhibiting a lower corrosion rate, based on, for example, weight loss or percentage weight change, than comparable silver-based FIP EMI shielding gaskets.

By "fluent," it is meant that the admixed composition exhibits representative fluid flow characteristics allowing it to be extruded under pressure through a dispensing nozzle, needle, or other orifice at a given flow velocity. For example, flow rates through an 8–10 mm orifice of between about 0.025–2.75 g/min at from about 275–400 kPa typically are observed. The uncured composition, moreover, is provided to be sufficiently viscous, e.g., 1,000–10,000 poise at 25° C., such that it may be dispensed on a substrate as a generally continuous, form-stable bead and thereafter cured directly thereon under atmospheric pressure without the use of a mold. By "form-stable," it is meant that the uncured bead of the composition which is applied to the substrate exhibits substantially no appreciable slump, sag, or running prior to the curing thereof to form an elastomeric gasket material.

The binder component and cross-linking component may be provided as forming a cured elastomeric material via a thermal addition polymerization, i.e., a vulcanization or cross-linking mechanism, when admixed. By "cured" it is meant that the binder of the composition is polymerized, cross-linked, further cross-linked or polymerized, vulcanized, cooled, hardened, or otherwise chemically or physically changed from a liquid or other fluent form into a solid elastomeric or polymeric phase. Thermal addition cure systems, which may be foamed or unfoamed, of the general type herein involved are well-known and characterized by a curing mechanism involving the direct cross-linking reaction of functional group species on adjacent molecules which also may be oligomers or polymers. The cross-linking reaction is thermally accelerated and has a cure profile which may include a predefined cure or critical temperature for a given heating time.

Although the curing reaction may occur between the same molecules or functional groups, and alternatively may be moisture or UV-catalyzed at ambient temperature, a preferred system of the invention incorporates a polymeric, silicone-based binder component having a first functional species, such as vinyl groups, and a silicone-based cross-linking agent having a second functional species, such as hydride groups, different from the first functional species but which are reactive therewith. That is, the first and second species exhibit reactive affinity above a certain activation energy level such that a thermally-induced cross-linking reaction is effected at temperatures at or above a particular cure temperature resulting in the curing of the reaction system to form a form-stable elastomeric material. As used herein, the term "elastomeric" is ascribed its conventional meaning of exhibiting rubber-like properties of resiliency, low compression set, flexibility, and an ability to recover after deformation. As with silicone elastomers in general, the preferred silicone material exhibits properties such as thermal and oxidation resistance over a wide temperature range, and well as resistance to many chemicals and to weather effects, which makes it especially suited for use as an EMI shielding gasket. In addition to improved corrosion resistance, the material further exhibits excellent electrical properties including resistance to corona breakdown over a wide range of temperatures and humidity.

Together, the binder and cross-linking component, each of which may have a respective weight average molecular weight of between about 70,000–90,000,may be classified as a silicone-based, thermal-addition curable or cross-linking elastomeric composition. A particularly preferred combination includes a linear vinyl-terminated siloxane polymer, such as vinyl-terminated polydimethyl siloxane, as the binder component, and at least a stoichiometric, molar amount of a hydride-terminated siloxane, siloxane polymer, or siloxane copolymer, as the cross-linking agent. In a preferred embodiment of the invention, the binder and cross-linking agent components are admixed in a one-part system. Alternatively, the binder component may be included in a first part of a two-part system, with the cross-linking agent component being included in a second part formulated to be mixed in equal volumetric proportion with the first component part. In either system, one or both parts additionally may include a carrier, such as a silicone or silicone-compatible fluid, a diluent such as toluene, alcohol, or other organic solvent, or additional binder component including the first functional group species. Silicone-based compositions of particularly preferred variety are marketed commercially by Dow Corning Corp., Midland, Mich., by General Electric Co., Silicone Products Div., Pittsfield, Mass., and particularly by Shin-Etsu Corp., Torrance, Calif., under the designations 1820 and 1830.

An inhibitor such as 2-methyl, 3-butyn 20', polyvinylmethyl siloxane, or octamethyltrisiloxane optionally may be included in the single part or in the second part of the two-part formulation for inhibiting the reaction at room temperature between the first and second functional group species and thereby increasing the pot-life or open-time of the mixture. At elevated curing temperatures of from about 85–150° C., however, the inhibitor is volatilized to thereby allow the cross-linking reaction between the first and second functional groups to proceed to cure. A metallic catalyst, such as an organometallic platinum catalyst, likewise may be included the single part or in the first part of the two-part formulation to catalyze the thermal addition cross-linking reaction between the first and second functional groups. Generally, from about 5–10 ppm of such catalyst, based on the total weight of the functional siloxane components, is included with the first component.

In accordance with the precepts of the present invention, the one or two-part silicone-based elastomeric composition is rendered electrically conductive via its loading with an electrically-conductive, nickel-coated graphite filler selected particularly for its improved corrosion resistance as compared to conventional silver-based fillers. By "nickel-coated graphite," it is meant that the filler is of a composite structure consisting of a graphite, i.e., elemental carbon in allotropic form, core and a nickel metal coating. A preferred composition is from about 60–70% nickel by weight.

The shape of the nickel-graphite filler is not considered particularly critical to the present invention, but broadly is classified as particulate to include any shape that is conventionally involved in the manufacture or formulation of fluent, conductive materials of the type herein involved including solid spheres, hollow microspheres, flakes, platelets, chopped or milled fibers, or irregularly-shaped particles, but preferably will be a powder to assure uniform dispersal and homogeneous mechanical and electrical properties. Similarly, the particle size of the filler is not considered critical, provided that the material remains fluent in its uncured state, but generally will be in the range of from about 0.25–250 $\mu$m, with a range of from about 0.25–75 $\mu$m being typical. A preferred nickel-coated graphite particulate filler is marketed commercially by Novamet, Wyckoff, N.J., as a "63.4% Nickel Coated Graphite."

The nickel-coated graphite filler of the present invention is loaded in a proportion sufficient to provide the level of electrical conductivity and EMI shielding effectiveness in the cured gasket that is desired for the intended application. For typical applications, an EMI shielding effectiveness, as measured according to Test Method TP-08, of at least 80 dB over substantially the entire frequency range of between about 10 MHz to 10 GHz is considered acceptable. Such effectiveness translates to a filler proportion which generally is between about 50–60% by weight, based on the weight volume of the reaction system, or between about 20–30% by volume. As is known, however, the ultimate shielding effectiveness of the cured gasket will vary based on the amount of electrically-conductive material in the filler and the imposed load or deflection, typically between about 10–50%, of the gasket.

It is contemplated that the electrically-conductive filler of the present invention normally will consist essentially entirely of nickel-coated graphite particles. However, the inclusion of other electrically-conductive fillers should be considered to be within the scope of the invention herein involved to the to the extent that the corrosion resistance of the finished gasket is not unduly compromised or, in one-part systems, the catalytic activity of the platinum or other metal catalyst component is not overly reduced. Other such electrically-conductive fillers can include, broadly, noble or non-noble metal-based fillers such as: pure or plated noble or non-noble metals; noble or non-noble metal-plated non-metals such as plated glass, ceramic, plastic, and mica; and mixtures thereof.

As aforementioned, a solvent or other diluent may be employed during the compounding of the formulation to lower the viscosity of the material for improved mixing and delivery. Other conventional rheological agents and additives, such as pigments, microwave-attenuating or thermally-conductive fillers, lubricants, wetting agents, stabilizers, antioxidants, coloring or opacifying agents, fire retardants, chain extending oils, tackifiers, blowing agents, foaming or anti-foaming agents, and the like, optionally may be incorporated into the formulation depending upon the requirements of the particular application envisioned.

Formulated as described, the admixed thermal addition reaction system of the present invention is essentially thermosetting following a prescribed cure schedule. Such a cure schedule involves the exposure of the composition to a cure temperature of between about 85–150° C., for a period of between about 30–60 minutes, or otherwise until a full cure is effected. For example, within the preferred temperature range and heating or cure times, compression sets at 50% deflection of about 30–50% may be achieved. Of course, the total thermal energy transferred is a function of both the cure temperature and the heating time, with cure time and temperature being inversely proportional. That is, the cure is thermally accelerated such that lower cure temperatures require longer heating times, with higher cure temperatures requiring shorter heating times. However, it will be understood that if a moisture, i.e., RTV, or UV-curable silicone binder system is substituted for the thermal addition system of the illustrated embodiment, then the heating step may be eliminated or replaced with the exposure of the material to UV radiation or ambient humidity.

Further regarding the system cure, it is well-known that when convention silver-based, electrically-conductive fillers are used in conjunction with the preferred platinum catalyst for the silicone binder and cross-linking components of a thermal addition system, the catalytic activity of the platinum is deactivated or "poisoned" over time by the silver in the filler. For example, upon the aging or storage of the respective parts of a 2-part, thermal addition formulation, the catalytic activity of the platinum is inhibited to an extent that the admixed parts may not cure unless heated to a relatively high cure temperature which could exceed the service temperature of the substrate. Indeed, it has been determined experimentally that substantially no cure is effected at lower temperatures of around 100° C. even with the replenishment of the platinum catalyst by the addition of "fresh" catalyst to the mixture. Because of this catalytic deactivation, prior art thermal addition cure systems, although affording faster cure times and more controlled cures as compared to moisture cure system, had to be formulated in at least two parts, with the cross-linking agent and catalyst being separated from the resin component. Generally, however, a one-part formulation would be considered preferred as requiring less shipping and storage space and fewer processing steps during dispensing. In this regard, then, the substitution of the nickel-graphite filler of the present invention for the conventional silver-based fillers advantageously obviates the above-described positioning problem and allows for the formulation of a one-part, FIP reaction system.

The cured gasket material of the invention has been observed to exhibit primerless adhesion to a variety of substrates, including aluminum, magnesium, nickel, copper, and plastics. An initial adhesion is shown immediately after cure, which adhesion improves after aging 3–7 days at room temperature. Although not generally required, a surface primer such as a functionalized silane, a silicate ester, a silicone-based adhesive, a cyanurate, or the like, also may be used to further improve the adhesion of the gasket to the substrate. Failure modes with either primed or unprimed substrates typically are observed to be cohesive rather than adhesive.

As aforementioned, the finished gasket of the present invention further has been observed to exhibit an EMI shielding effectiveness (TP-08) of at least 80 dB over a frequency range of between about 10 MHz to 10 GHz. Such a high level of EMI shielding effectiveness is unexpected, however, considering that at the contemplated filler loading levels, the strip volume resistivity of the inventive composition would, it is believed, be considered too low to provided an acceptable level of EMI shielding effectiveness. That is, at the relatively low filler levels of 50–60% by weight, and small particle sizes of 0.25–75 $\mu$m necessary to maintain fluency, the nickel-graphite filled composition of the invention is observed to exhibit a relatively high strip volume resistivity (ASTM D991) of 500–1000 m$\Omega$-cm. In contrast, conventional silver-based FIP compositions, in exhibiting typical strip volume resistivites of about 1–50 m$\Omega$-cm, are about 10–100 times more electrically conductive than the instant nickel-graphite filled composition. Similarly, at the high filler loading levels and correspondingly high electrical conductivities characteristic of EMI shielding coatings, extrusions, and moldings, it is likewise is believed to be not apparent from these materials that a non-molded, corrosion-resistant, nickel-graphite filled FIP gasket could be achieved exhibiting a relatively high EMI shielding effectiveness of about 80 dB or more.

Advantageously, the nickel-graphite filled reaction system of the present invention may be formulated to achieve a formed-in-place, EMI shielding gasket having a synergistic convergence of physical properties making such gasket suitable even for low closure force applications. For example, representative finished gaskets according to the present invention have been observed to exhibit a Shore A hardness (ASTM D2240) of less than about 60, closure forces (Chomerics in-house procedure) of less than about 1 N/cm (5 lb$_f$/in), force/deflection (Chomerics in-house procedure) values less than about 2.6 kN/m (15 psi), and compression sets (Chomerics in-house procedure) of less than about 50%. This convergence allows for the deflection of the gasket sufficient to effect an intimate, conformal contact and good electrical continuity between the faying surfaces of the electronics enclosure or other application involved. These and other physical properties, and especially compression set, can vary with the filler loading level, and also may be tailored for the particular application with the addition of up to about 10 % of a reinforcement or other inert or reactive component. Preferred reinforcements include fumed or crystalline silica, glass or polymeric microballoons, and particularly acrylonitrile microballoons.

For commercial applications, the constituents of the reaction system may be compounded in a roll mill or other mixer. After compounding, the pre-mixed one or more component parts may be loaded into individual tubes or containers and stored for later reactive processing using a hand-held caulking gun, which may be of a cartridge-fed, static-mixer variety, or, alternatively, using automated injection equipment such as a robotic applicator having two or more degrees of freedom or an x-y table with a stationary dispensing head. For two or more part systems, the respective component parts may be admixed immediately prior to application, and then delivered as a bead of a reactive mixture to a surface of a housing or other enclosure or substrate. The mixture then is cured in situ on the substrate surface to form the thermally-conductive interlayer of the present invention. To reduce the cycle time, the curing may be effected at an elevated temperature to accelerate the vulcanization reaction. The components alternatively may be pre-mixed and then frozen for storage.

Looking to FIG. 1, a preferred commercial delivery system is shown generally at 10 as including a roboticly-controlled dispense head, 12, having a nozzle, 14, with an orifice of a select diameter. Dispense head 12 is provided to be in fluid communication with a material supply system, not shown, which may include one or more proportional, pneumatically-controlled cylinders for delivering an apportioned amount of each of the one, two, or multi- part system components through an in-line static or dynamic mixer or the like. Thereafter, the admixed components may be passed to another proportioning, pneumatic cylinder for controlled delivery to head 12.

Figure 2:
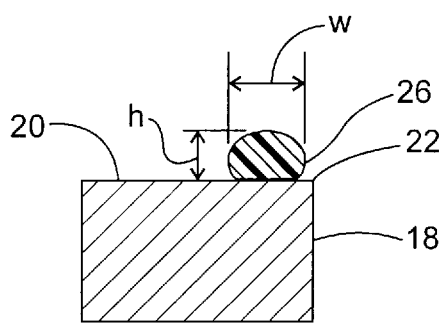
FIG. 2 is a cross-sectional view taken through line 2—2 of FIG. 1 showing the bead of claim 1 as cured in situ on the surface of the substrate to form a electrically-conductive, elastomeric EMI shielding gasket.

Head 12 is operated for movement in one or more axes relative to an associated table, 16. Table 16, which may be stationary or also movable in one or more axes relative to head 12, supports a workpiece, 18, thereon which, as is shown, may be a housing or other enclosure for an electronic device. Housing 18 has an upper surface, 20, with a periphery, 22, along which head 12 and/or table 16 is moved in a predetermined path, 24. As one or both of the head 12 or table 16 is translated relative to the other, an uncured, viscoelastic bead, 26, of the admixed material is issued under pressure from nozzle 14 of head 12 generally along path 24. As may be seen with additional reference to FIG. 2, bead 26, which is non-slumping and otherwise form-stable, may be applied, as is shown, directly to the surface 20 of housing 18 or, alternatively, into a groove or channel (not shown) thereof. Typically, bead 26 will be of widthwise dimension, "w," of from about 1–100 mm, with an aspect ratio of width w to height, "h," of from about 0.25:1 to 3:1 or higher. For more critical applications such as cellular phone housings, however, bead 26 typically will have a widthwise dimension w of between about 1–10 mm with a corresponding cross-sectional area of less than about 10 mm$^2$ (0.015 in$^2$). Following the completion of the bead application, housing 18 may be heated batchwise or in a conveyor oven according to a predefined cure schedule to effect the in situ curing of bead 26 into an electrically-conductive, elastomeric EMI shielding gasket material which is integrally adhered to surface 20 of housing 18.

The Examples to follow, wherein all percentages and proportions are by weight unless otherwise expressly indicated, is illustrative of the practicing of the invention herein involved, but should not be construed in any limiting sense.

EXAMPLES

EXAMPLE 1

Sample batches, identified as 4342-109, -111 and -115, of a corrosion-resistant, electrically-conductive FIP material were prepared in accordance with the present invention for characterization. The batches were formulated from commercially-available, one-part, silicone formulations (Shin-Etsu 1820 and 1830) which were blended at a ratio of 2:1 by weight of 1830 to 1820. Each of the one-part formulations comprised a vinyl-functional siloxane polymer component, hydride-functional siloxane component, and an organometallic platinum catalyst. The batches were compounded in a roll mixer as loaded with about 56 wt% of a 63.4% nickel-coated graphite filler (Novamet) having a particle size distribution of from about 50–200 μm, and with about 1 wt% of acrylonitrile copolymer microballoons (Pierce and Stevens). Different filler lots were used in each of the three formulations.

The electrical and physical properties of the sample batches were characterized and compared with those of two commercially-available, two-part, silicone-based FIP formulations, Cho-Form® 5513A/B and 5514A/B (Parker Chomerics Division, Woburn, Mass.), with the Cho-Form® 5514 including a proprietary cure promoting additive. The commercial 5513 and 5514 systems were based on a thermal addition silicone system that was similar to that of the sample batches, but as filled with about 70–80 wt% of a conventional silver-plated copper filler.

Formulated as described, each of the sample batches and commercial formulations was characterized through lap shear testing with aluminum coupons (1-inch width, ½-inch overlap), compression/deflection force testing, compression set testing, and corrosion-resistance determined on a weight loss basis. These data were acquired both after curing at 100° C. for 40 minutes, and after curing at 138° C. for 30 minutes. The density, hardness, tensile strength, % elongation, strip volume resistivity (SVR) of each of the batches also were characterized using bulk data obtained from slabs or discs which were compression molded at 138° C. for 5 minutes and then heated for 25 minutes in a 138° C. oven. The following values were recorded:

TABLE 1

Lap Shear Strength (psi)

| | Cure Temperature | |
|---|---|---|
| Sample | 100° C. | 138° C. |
| 4342-109 | 83 adh.[1] | 312 coh.[2] |
| 4342-111 | 91 adh. | 377 coh. |
| 4342-115 | 134 adh. | 338 coh. |
| 5513 | n.d. | 165 60% coh. |
| 5514 | 317 coh. | n.d. |

[1]Adhesive Failure Mode
[2]Cohesive Failure Mode
[3]No Data

TABLE 2

Compression Set[1] (%)

| | Cure Temperature | |
|---|---|---|
| Sample | 100° C. | 138° C. |
| 4342-109 | 30 | 12 |
| 4342-111 | 35 | 10 |
| 4342-115 | 27 | 8 |
| 5513 | n.d | 28 |
| 5514 | 28 | n.d. |

[1]50% deflection, 22 hours @ 85° C.

TABLE 3

Hardness[1] (Shore A)

| | Cure Temperature | |
|---|---|---|
| Sample | 100° C. | 138° C. |
| 4342-109 | 46 | 48 |
| 4342-111 | 45 | 47 |
| 4342-115 | 44 | 47 |

TABLE 3-continued

| | Hardness[1] (Shore A) | |
|---|---|---|
| | Cure Temperature | |
| Sample | 100° C. | 138° C. |
| 5513 | n.d | 45 |
| 5514 | 47 | n.d. |

[1]0.25-inch diameter disc, "open" cure

TABLE 4

| | Corrosion Resistance[1] (wt. loss in mg) | |
|---|---|---|
| | Cure Temperature | |
| Sample | 100° C. | 138° C. |
| 4342-109 | 10 | 13 |
| 4342-111 | 3 | 2 |
| 4342-115 | 2 | 5 |
| 5513 | n.d | 128 |
| 5514 | 125 | n.d. |

[1]CHO—TM 100

TABLE 5

| | Bulk Property Data | | | | | | | | | |
|---|---|---|---|---|---|---|---|---|---|---|
| | 4342-109 | | 4342-111 | | 4342-115 | | 5513 | | 5514 | |
| Property | 100° | 138° | 100° | 138° | 100° | 138° | 100° | 138° | 100° | 138° |
| Tensile (psi) | 549 | 569 | 521 | 572 | 521 | 562 | n.d. | 289 | 384 | n.d. |
| % Elongation | 130 | 129 | 135 | 130 | 142 | 134 | n.d. | 168 | 244 | n.d. |
| Hard.[1] (Shore A) | 66 | 66 | 63 | 66 | 66 | 67 | n.d. | 58 | 58 | n.d. |
| SVR[2] (mΩ/cm) | 344 | 920 | (0)[4] | 3271 | 6356 | 848 | n.d. | 4.5 | 27 | n.d. |
| Aged SVR[3] (mΩ/cm) | 500 | 2087 | (0)[4] | 31,246 | 7101 | 1264 | n.d. | 7.2 | 61 | n.d. |
| Density (g/cm$^3$) | 2.1 | 2 | 2 | 2 | 2.04 | 2.03 | n.d. | 3.4 | 3.4 | n.d. |

[1]ASTM D2240
[2]ASTM D991
[3]Aged 48 hours at 85° C.
[4]No reading

TABLE 6

| | Compression/Deflection-Force[1] (ppi) | | | | | | | | | |
|---|---|---|---|---|---|---|---|---|---|---|
| | 4342-109 | | 4342-111 | | 4342-115 | | 5513 | | 5514 | |
| Deflection | 100° | 138° | 100° | 138° | 100° | 138° | 100° | 138° | 100° | 138° |
| 25% | 2.7 | 3.2 | 2.3 | 2.3 | 2.5 | 2.8 | n.d. | 3.6 | 3 | n.d. |
| 40% | 5.9 | 8 | 5.4 | 5.3 | 7 | 8.6 | n.d. | 9.3 | 7.1 | n.d. |
| 50% | 9.3 | 12.8 | 8.7 | 8.6 | 13.7 | 16.8 | n.d. | 14 | 13.4 | n.d. |
| 65% | 13 | 17 | 154 | 15 | 32 | 39 | n.d. | 43 | 45 | n.d. |

[1]Nominal bead height 0.04 in

TABLE 7

Compression/Deflection-Resistance (mΩ)[1]

| Deflection | 4342-109 | | 4342-111 | | 4342-115 | | 5513 | | 5514 | |
|---|---|---|---|---|---|---|---|---|---|---|
| | 100° | 138° | 100° | 138° | 100° | 138° | 100° | 138° | 100° | 138° |
| 25% | 143 | 95 | 2352 | 930 | 317 | 157 | n.d. | 11 | 18 | n.d. |
| 40% | 28 | 15 | 353 | 165 | 44 | 22 | n.d. | 3 | 6 | n.d. |
| 50% | 12 | 3 | 123 | 65 | 16 | 7 | n.d. | 14 | 3 | n.d. |
| 65% | 2 | 2 | 18 | 13 | 4 | 2 | n.d. | 0.5 | 1 | n.d. |

[1]Nominal bead height 0.04 inch

The foregoing results show that the formulation of the present invention exhibits both strip and deflected electrical resistivites that are about 10–100 times more than the resistivites of comparable silver-filled materials. In view of these data, it is believed that FIP gaskets prepared from such formulation would not be expected to provide acceptable EMI shielding performance. The remainder of the results do confirm, however, that the cured material of the invention exhibits physical properties comparable to silver-filled FIP materials.

EXAMPLE 2

The EMI shielding effectiveness of the FIP materials described in Example 1 were characterized in accordance with Chomerics Test Method TP-08, with the following average values being recorded:

TABLE 8

Average EMI Shielding Effectiveness[1]

| Sample | EMI Shielding Effectiveness (dB) |
|---|---|
| 4342-109 | 85 |
| 4342-111 | 55 |
| 4342-115 | 76 |
| 5513 | 100 |
| 5514 | 96 |

[1]Test Method TP-08

The data obtained at the 100° C. cure for the nickel-graphite filled 4342-109, -111, and -115 sample materials and for the silver-filled 5514 control material is graphically portrayed in FIG. 3 as a plot of attenuation versus frequency. From FIG. 3, it may be seen that notwithstanding the relatively high resistivites of the nickel-graphite filled materials, shielding effectivenesses generally above an 80 dB threshold and approaching that of the silver-filled control material were observed over substantially the entire frequency range measured. Indeed, even the 4342-111 sample, the strip volume resistivity of which was so high that it could not be measured with the available conductivity probe, nonetheless exhibited an appreciable, albeit less than optimal, level of EMI shielding effectiveness.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A one-part, fluent polymeric reaction system which may be applied as a form-stable bead to a surface of a substrate and cured by thermal-addition thereon under substantially atmospheric pressure to form a corrosion-resistant, electrically-conductive, elastomeric EMI shielding gasket having an EMI shielding effectiveness of at least about 80 dB substantially over a frequency range of between about 10 MHz and about 10 GHz, said reaction system having a strip volume resistivity of from about 500–1000 mΩ-cm and comprising an admixture of:
   (a) a silicone resin binder component including a first functional group;
   (b) a cross-linking agent component including a second functional group reactive with said first functional group of said binder component;
   (c) a metallic catalyst component effective to catalyze the reaction of said first and second functional groups; and
   (d) an electrically-conductive filler component comprising nickel-coated graphite particles.

2. The reaction system of claim 1 further comprising one or more additives selected from the group consisting of fumed silica, crystalline silica, glass or polymeric microballoons, and mixtures thereof.

3. The reaction system of claim 1 wherein said catalyst component is a platinum catalyst.

4. The reaction system of claim 1 wherein said filler component comprises, by weight of said filler, between about 60–70% nickel.

5. The reaction system of claim 1 wherein said filler component has a particle size of from about 0.25–75 µm.

6. The reaction system of claim 1 which comprises, by weight of components (a)–(d), from about 50–60% of said filler.

7. The reaction system of claim 1 wherein said first functional groups are vinyl functional groups and said second functional groups are hydride functional groups.

8. The reaction system of claim 7 wherein said binder component is a vinyl-functional siloxane polymer, and said cross-linking agent component includes a hydride-functional siloxane.

9. The reaction system of claim 1 wherein said filler component consists essentially of nickel-coated graphite particles.

10. An electrically-conductive, corrosion-resistant EMI shielding gasket having an EMI shielding effectiveness of at least about 80 dB substantially over a frequency range of between about 10 MHz and about 10 GHz which is formed-in-place on a surface of a substrate as applied to said surface in a form-stable bead of a fluent polymeric reaction system and cured thereon under substantially atmospheric pressure, said reaction system having a strip volume resistivity of from about 500–1000 mΩ-cm and comprising an admixture of:
   (a) an elastomeric resin binder component; and
   (b) an electrically-conductive filler component comprising nickel-coated graphite particles.

11. The shielding gasket of claim 10 having a Shore A hardness of less than about 60, a force/deflection value of less than about 2.6 kN/m (15 psi), a compression set of less than about 50%, and a closure force of less than about 1 N/cm (5 lb$_f$/in).

12. The shielding gasket of claim 10 wherein said bead has a cross-sectional area of less than about 10 mm$^2$ (0.015 in$^2$).

13. The shielding gasket of claim 10 wherein said reaction system further comprises one or more additives selected from the group consisting of fumed silica, crystalline silica, glass or polymeric microballoons, and mixtures thereof.

14. The shielding gasket of claim 10 wherein said filler component comprises, by weight of said filler, between about 60–70% nickel.

15. The shielding gasket of claim 10 wherein said filler component has a particle size of from about 0.25–75 μm.

16. The shielding gasket of claim 10 wherein said resin binder component includes a first functional group and wherein said reaction system further comprises:

(c) a cross-linking agent component including a second functional group reactive with said first functional group of said binder component; and (d) a metallic catalyst component effective to catalyze the reaction of said first and second functional groups.

17. The shielding gasket of claim 16 wherein said catalyst component is a platinum catalyst.

18. The shielding gasket of claim 16 which comprises, by weight of components (a)–(d), from about 50–60% of said filler component.

19. The shielding gasket of claim 16 wherein said first functional groups are vinyl functional groups and said second functional groups are hydride functional groups.

20. The shielding gasket of claim 19 wherein said binder component is a vinyl-functional siloxane polymer, and said cross-linking agent component includes a hydride-functional siloxane.

21. The shielding gasket of claim 10 wherein said filler component consists essentially of nickel-coated graphite particles.

22. A method of forming an electrically-conductive, corrosion-resistant elastomeric EMI shielding gasket in situ on a surface of a substrate, said gasket having an EMI shielding effectiveness of at least about 80 substantially over a frequency range of between about 10 MHz and about 10 GHz, and said method comprising the steps of:

(a) providing a fluent, polymeric reaction mixture having a strip volume resistivity of from about 500–1000 mΩ-cm and comprising:
  (i) an elastomeric resin binder component; and
  (ii) an electrically-conductive filler component comprising nickel-coated graphite particles;

(b) applying a bead of said reaction mixture to the surface of the substrate; and (c) curing said reaction mixture under substantially atmospheric pressure to form said gasket on the surface of the substrate.

23. The method of claim 22 wherein said gasket of step (c) has a Shore A hardness of less than about 60, a force/deflection value of less than about 2.6 kN/m (15 psi), a compression set less than about 50%, and a closure force of less than about 1 N/cm (5 lb$_f$/in).

24. The method of claim 22 wherein said bead of step (b) has a cross-sectional area of less than about 10 mm$^2$ (0.015 in$^2$).

25. The method of claim 22 wherein said reaction mixture of step (a) further comprises one or more additives selected from the group consisting of fumed silica, crystalline silica, glass or polymeric microballoons, and mixtures thereof.

26. The method of claim 22 wherein the filler component (ii) of said reaction mixture of step (a) comprises, by weight of said filler, between about 60–70% nickel.

27. The method of claim 22 wherein the filler component (ii) of said reaction mixture of step (a) has a particle size of from about 0.25–75 μm.

28. The method of claim 22 wherein the resin binder component (i) of said reaction mixture of step (a) includes a first functional group and wherein said reaction mixture further comprises:

(iii) a cross-linking agent component including a second functional group reactive with said first functional group of said binder component; and (iv) a metallic catalyst component effective to catalyze the reaction of said first and second functional groups.

29. The method of claim 28 wherein said catalyst component is a platinum catalyst.

30. The method of claim 28 wherein said reaction mixture is cured in step (c) by heating said bead to a predefined cure temperature.

31. The method of claim 28 wherein said reaction mixture comprises, by weight of components (i)–(iv), from about 50–60% of said filler.

32. The method of claim 28 wherein said first functional groups are vinyl functional groups and said second functional groups are hydride functional groups.

33. The method of claim 32 wherein said binder component is a vinyl-functional siloxane polymer, and said cross-linking agent component includes a hydride-functional siloxane.

34. The method of claim 22 wherein the surface of the substrate is unprimed.

35. The shielding gasket of claim 22 wherein the resin binder component (ii) of said reaction mixture of step (a) consists essentially of nickel-coated graphite particles.

36. The EMI shielding gasket formed by the method of claim 22.

* * * * *